United States Patent [19]

Vandzura

[11] Patent Number: 4,845,384
[45] Date of Patent: Jul. 4, 1989

[54] DYNAMIC LOGIC UNITS

[75] Inventor: James M. Vandzura, Monroeville, Pa.

[73] Assignee: Westinghouse Electric Corp., Pittsburgh, Pa.

[21] Appl. No.: 168,826

[22] Filed: Mar. 16, 1988

[51] Int. Cl.$^4$ ............................................. H02H 3/24
[52] U.S. Cl. .................... 307/407; 307/411;
 307/413; 307/416; 328/65; 328/67; 376/259;
 376/215; 376/254
[58] Field of Search ................ 307/106–109,
 307/400–419; 328/65, 67; 376/215–219, 245,
 250, 255, 254, 259; 336/212–219, 221, 222, 233,
 229, 205; 361/139, 203, 204, 210; 323/356

[56] References Cited

U.S. PATENT DOCUMENTS

| | | | |
|---|---|---|---|
| 1,884,845 | 10/1932 | Peterson | 307/416 |
| 2,920,824 | 1/1960 | Lanning | 307/411 X |
| 2,920,825 | 1/1960 | Lanning | 307/411 X |
| 2,966,595 | 12/1960 | Williams | 307/413 |
| 3,104,373 | 9/1963 | Salihi | 307/413 X |
| 3,305,838 | 2/1967 | Kidd et al. | 307/415 |
| 3,541,428 | 11/1970 | Schwarz | 307/401 X |
| 3,999,104 | 12/1976 | Lardennis | 307/413 X |
| 4,338,650 | 7/1982 | Wierschke . | |
| 4,513,274 | 4/1985 | Halder . | |
| 4,661,310 | 4/1987 | Cook et al. . | |

OTHER PUBLICATIONS

"Logical and Control Functions Performed with Magnetic Cores", by S. Guterman et al., from *Proceedings of the Ire*, pp. 291–298.

"The Laddic–A Magnetic Device for Performing Logic", by U. F. Gianola et al., from *The Bell System Technical Journal*, Jan. 1959, pp. 45–72.

Collected Information on Safety Systems supplied by GEC–Elliott Process Automation Ltd.

*Primary Examiner*—William M. Shoop, Jr.
*Assistant Examiner*—Paul Ip
*Attorney, Agent, or Firm*—B. R. Nath

[57] ABSTRACT

Dynamic logic units utilize magnetic cores of rectangular hysteresis loop material wound with an input winding, a pair of output windings connected to a CMOS flip-flop, and a d-c control winding. With a d-c current on the control winding, the core experiences flux reversals in response to a square wave on the input winding to generate output pulses which alternately switch the flip-flop to produce a square wave output which matches the input. In a first embodiment, the output windings are in the form of a center-tapped winding with the center tap grounded to provide a low impedance discharge path for the capacitors in grounded R-C filters on the inputs to the flip-flop which suppress voltage spikes. In a second embodiment, output windings on separate magnetic cores which share an input windings but only one of which has a control winding, are connected in opposition to eliminate the switching spikes in the signal applied to the flip-flop.

12 Claims, 2 Drawing Sheets

DYNAMIC LOGIC UNITS

BACKGROUND OF THE INVENTION

1. Field of the Invention

This invention relates to logic units for pulsed circuits and more particularly to such logic units having saturable magnetic cores which pass applied pulse signals in the presence of a d-c control current and block the applied pulse signals in the absence of the control current.

2. Background Information

Dynamic logic units are logic circuits which operate with pulsed signals. One type of logic unit for pulse circuits is disclosed in U.S. Pat. No. 4,661,310. This logic unit includes a core of rectangular hysteresis loop material on which is wound an input winding, a control winding and an output winding. A d-c current of sufficient magnitude to saturate the core in one direction is selectively applied to the control winding. The pulse signal applied to the input winding is of a polarity and magnitude sufficient to drive the core into saturation in the opposite direction. Thus, with the control winding energized, the core experiences large flux reversals as it is alternately driven into saturation in one direction and then the other. This generates a pulse signal on the output winding. With the control winding deenergized the pulses are essentially blocked as the core remains saturated in the direction imposed by the input pulses.

In order to generate a true representation of the input pulses from the pulses appearing on the output winding, which are induced by the leading and trailing edges of the input pulses, a flip-flop is connected to the output winding. In addition, low pass R-C filters are connected between the output winding and the set and reset inputs of the flip-flop to prevent voltage spikes generated on the output winding when the control winding is deenergized from switching the flip-flop.

It has been found that these low pass R-C filters, although effective, integrate the signal on the output winding and deteriorate the leading edge of this signal which is input to a CMOS flip-flop. This, in turn, causes variations in the duty cycle of the waveform at the flip-flop output. In addition, where these dynamic logic units are used in protection systems for nuclear power plants, they must meet the Nuclear Regulatory Commission requirement that any single failure will not produce an undesired condition. There is some concern that a common mode failure of both filter capacitors would allow the flip-flop to continue to toggle on the unfiltered spikes.

In view of the above, there is a need for dynamic logic units utilizing saturable magnetic cores with improved response times; and There is also a need to provide such logic units which are economical to produce and require a minimum amount of circuit real estate.

SUMMARY OF INVENTION

These and other needs are satisfied by the invention which is directed to dynamic logic units having magnetic core means of rectangular hysteresis loop magnetic material, with an input winding, a pair of series connected output windings, and a control winding wound on the core means such that with a d-c current applied to the control winding of sufficient magnitude to saturate in one direction at least one part of the magnetic core means around which at least one of said output windings is wound, pulses applied to the input winding which are of sufficient magnitude to saturate the magnetic core means in the opposite direction, generate pulses across the series connected output windings, while the absence of current through the control winding blocks pulses from appearing across the output winding. Discriminator-shaper means connected across the series connected output windings produce output pulses similar to the pulses applied to the input winding.

In one embodiment of the invention, the discriminator-shaper includes a flip-flop with grounded R-C low pass filters connecting the output windings to the inputs of the the flip-flop, and the two output windings comprise a center-tapped winding with the center tap grounded. This embodiment provides low impedance discharge paths through the two halves of the center-tapped winding as the control current is switched off to prevent toggling of the flip-flop on switching spikes, and to therefore improve the response time of the dynamic logic unit.

In another embodiment of the invention, the magnetic core means comprises two cores of rectangular hysteresis loop magnetic material. A common input winding or two separate series connected input windings are wound on the two cores. Separate, series connected output windings of opposite polarity are wound on the two cores. A control winding is wound on only one of the cores. The switching spikes generated in the two oppositely wound output windings cancel each other out, both in the presence and absence of control current, while the large pulses developed in the one output winding in the presence of a d-c control current, appear at the output of the series connected output windings. Since the voltage spikes are cancelled out, the output terminals of the series connected output windings may be connected directly to the inputs of the flip-flop such as an R-S CMOS flip-flop, composed of cross-coupled NOR gates with only current limiting input resistors.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENTS

Figure 1:
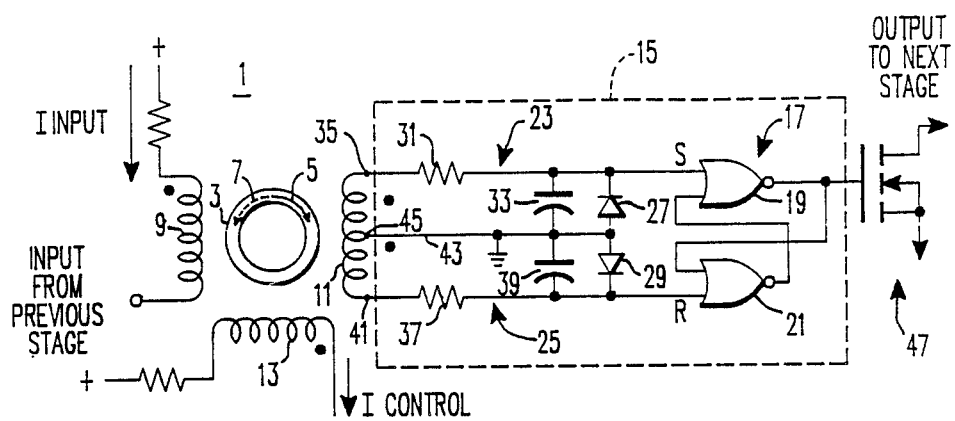
FIG. 1 a schematic circuit diagram of a dynamic logic unit in accordance with a first embodiment of the invention.

FIG. 1 illustrates a first embodiment of a dynamic logic unit 1 in accordance with the invention. This dynamic logic unit includes a magnetic core 3 of rectangular hysteresis loop magnetic materials, such as a tape wound toriodal core as shown. This core may be magnetized in two directions 5 and 7 as shown. Three coils are wound on the core 3; an input winding 9, a center-tapped output winding 11 and a control winding 13.

The output winding 11 is connected to a discriminator-shaper 15 which includes an R-S flip-flop 17 composed of two cross-coupled CMOS NOR gates 19 and 21, a pair of grounded R-C low pass filters 23 and 25, and a pair of diodes 27 and 29.

One low pass filter 23 comprising resistor 31 and capacitor 33 connects one terminal 35 of output winding 11 to the set input, S, of the flip-flop 17. Similarly, filter 25 comprising resistor 37 and capacitor 39 connects the other terminal 41 of output winding 11 to the reset input, R, of the flip-flop 17. Lead 43 connects the center tap 45 of output winding 11 to ground.

The output of the R-S flip-flop is applied to an amplifier 47 which serves as a driver for, for instance, another dynamic logic unit 1 in a multi-stage logic system such as that disclosed in U.S. Pat. No. 4,661,310.

Figure 2:
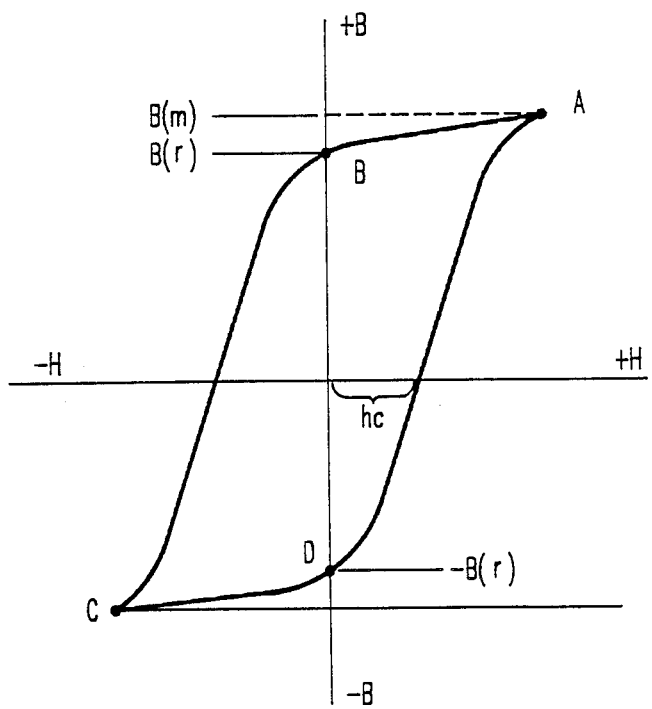
FIG. 2 is hysteresis diagram illustrating the magnetic characteristics of the cores of the dynamic logic units of the invention.

The operation of the dynamic logic unit 1 is based on flux reversals in the magnetic core 3. The hysteresis curve for the rectangular loop material of which the core is made is illustrated in FIG. 2. Three parameters of this curve are important to the operation of the device as a logic unit. These are: the maximum (saturation) magnetic flux, B(m); the residual flux B(r); and the "coercive force", hc, which is the driving magnetizing force required to switch the core. The residual flux remaining after the magnetizing force has been removed, along with the hysteresis of the material define two stable states: the clockwise 5 and anticlockwise 7 flux states shown in FIG. 1.

In the active state, a d-c current of the polarity indicated in FIG. 1 and of a magnitude sufficient to saturate the core in the counterclockwise direction 7 is applied to the control winding to place the core at the point C in FIG. 1 where the flux is −B(m). When a current pulse of the polarity indicated in FIG. 1 and of sufficient magnitude to overcome both the magnetizing force of the d-c current in control winding 13 and the coercive force, hc, is applied to the input winding 9, the core 3 switches into a clockwise flux state 7 at point D and eventually saturates at operating point A where the flux is +B(m).

This change in flux state of the core 3 induces a voltage pulse across the center-tapped output winding 11. When the current pulse is removed from input winding 9, the d-c current in the control winding 13, drives the core back to point C through point B, again producing a pulse at the output winding 11, but this time of opposite polarity. With a periodic pulse signal applied to the input winding 9, a continuous stream of output pulses appears on the output winding 11 as the flux switches between +B(m) and −B(m).

When the d-c current signal is removed from the control winding 13, continued pulses on the input winding 9 cause the flux to vary only between points A and B. This induces switching spikes in the output winding 11.

It can be appreciated that the pulses generated on the output winding 11 in the manner discussed above are not the same shape as the input pulses. The discriminator-shaper 15 restores the shape to the pulses and also discriminates between the large pulses generated as the core switches between saturation in the two opposed directions, and the spikes generated as the flux changes between saturation and residual flux when the control current is removed.

Pulses applied to the flip-flop 17 of the discriminator-shaper 15 cause its output to go high when a large pulse is applied to the set input, S, and to go low when such a pulse is applied to its reset input, R. The alternating polarity of the pulses generated on the output winding causes the output of the flip-flop to follow the pattern of the input pulses applied to the input winding 9. The diodes 27 and 29 reference the pulses applied to the gates to ground by conducting in the forward direction.

The low pass filters 23 and 25 assure that the spikes generated on the output winding in the absence of a control current do not operate the gates of the flip-flop 17. The time constant of these filters is such as to reduce the amplitude of the spikes while not detrimentally reducing the amplitude of the larger pulses which appear on the winding 11 when the core is undergoing flux reversal.

In the dynamic logic units described in U.S. Pat. No. 4,661,310, which does not have a center-tapped output winding with the center tap grounded, but rather has a single output winding connected at each end through a low pass filter to one of the inputs of the flip-flop, the nuisance switching spikes are attenuated but the overall response time of the circuit is unsatisfactory. The mode of operation of interest is immediately after the control winding current is removed. When this occurs, the core 3 is driven into saturation by the input winding current. The output winding then represents a low impedance path connecting both filter capacitors through two resistors. The capacitors therefore share any charge present prior to removal of the control winding current. Since both capacitors see a high impedance path to ground (the CMOS input and reverse biased diode), the voltage across them bleeds off slowly through any leakage paths present. This allows the voltage spikes present at the output winding to "ride" a decaying exponential, thus falsely triggering the CMOS flip-flop until the voltage falls below the CMOS gate's threshold. As the number of dynamic logic units connected in series increases, the overall response time becomes significant and unpredictable.

The dynamic logic unit 1 of FIG. 1 eliminates this problem with the use of a center-tapped output winding 11 having the center tap 45 connected to circuit common. With this configuration, when the control current is removed from winding 13, the core 3 saturates, and the output winding represents a low impedance path to ground. This quickly discharges capacitors 33 and 39 and removes any residual d-c bias. This in turn decreases the overall response time.

The advantages of the invention as applied in the dynamic logic unit of FIG. 1 include a reduction in the overall response time of the unit. The response time of the logic unit of FIG. 1 is dictated by the RC time constant of the filter circuit, and thus, is more predictable. In the dynamic logic units of U.S. Pat. No. 4,661,310, the response time is dependent upon the leakage paths to ground. When such circuits are cascaded, the response time is more unpredictable. In addition, this embodiment of the invention does not require any more components, although it does require twice as many turns in the output winding since the voltage present is halved by center tapping. Of course, two series connected output windings with the series connection grounded could be used in place of a center-tapped winding.

Figure 3:
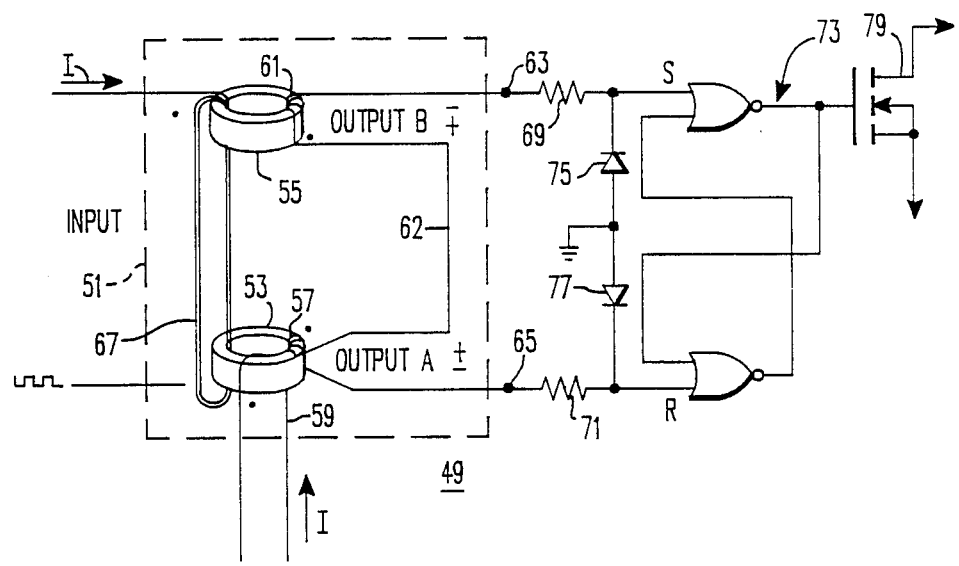
FIG. 3 is a schematic circuit diagram of a dynamic logic unit in accordance with another embodiment of the invention.

A second embodiment of the invention is illustrated in FIG. 3. This embodiment utilizes a compensating core and output winding to create a differential voltage which cancels the generated voltage spikes. This dynamic logic unit 49 includes a transformer package 51 having two magnetic cores 53 and 55 which are of the same rectangular hysteresis loop material and dimensions, and, therefore, exhibit the same magnetic properties. Core 53 has two independent windings: output winding 57 and control winding 59. Core 55 has only one independent winding, the output winding 61. The output windings 57 and 61 are oppositely wound on the respective cores to generate signals of opposite polarity, and are connected in series by lead 62 to form a single output at the terminals 63 and 65. Both cores 53 and 55 share a common input winding 67 and therefore experience the same magnetizing force due to this winding. The output terminals 63 and 65 are connected through current limiting input resistors 69 and 71 to the set, S, and reset, R, inputs respectively of an R-S CMOS flip-flop 73 similar to that in the embodiment of FIG. 1. As in the case of the first embodiment, diodes 75 and 77 reference the signals applied to the flip-flop to ground. Again, the output of the flip-flop 69 is applied to an amplifier 79 which may serve as a driver for another dynamic logic unit.

In the normal mode of operation of the embodiment of FIG. 3, the input winding 67 is driven with a square wave and a d-c current is present on the control winding 57. Since the core 55 does not have a control winding, its flux follows the path A-B-A, etc. only in FIG. 2. The portions of the curves A-B and C-D are the saturation regions where the unwanted voltage spike is generated. In these regions, both cores experience an abrupt change in the input winding current, and a voltage spike is induced across both output windings 57 and 61. Since these windings are connected in opposition to one another, the resultant voltage is zero. This effectively eliminates the output spikes as seen at the output terminals 63 and 65.

In the transitions from B to C or D to A in Figure 2, the unsaturated regions, the flux change in core 57 will support a voltage V for a time T. The product of V and T is a constant which depends on the physical properties of the cores. Core 55, however, does not traverse this same path since it does not have the control winding 59. Core 55 remains at point B or A, and its output voltage is zero. The resultant output voltage is therefore the sum of both outputs which is the voltage due to the core 53 only.

In the blocking mode of operation, the control winding current is removed from core 53, and it follows the same flux path A-B-A etc as the core 55. Thus, the cores 53 and 55 generate the same voltage spikes, but since they are connected in opposition, they cancel each other, and the voltage across the terminals 63 and 65 is zero. Since no voltage spikes which could falsely trigger the CMOS flip-flop 73 appear at the terminals 63 and 65, the low pass filters which reduce the amplitude of such spikes are not required.

In the embodiment of FIG. 3, both cores 53 and 55 share a common input winding. Instead, two separate transformers, one with a control winding and one without, could be connected with their input windings in series. However, this approach would subject the design to the possibility of a single failure disabling the circuit. That is, a short circuit in the input winding of the compensating core would cause its output winding to also appear as shorted, and therefore, the spikes would no longer be cancelled. With a shared winding, a short in the input winding disables both cores. This would be important where the logic unit was to be used in an application requiring a high level of safety. For instance, the Nuclear Regulatory Commission regulations require that any single failure in a circuit used for a control or protection system in a nuclear reactor not result in an unsafe condition.

The embodiment of FIG. 3 automatically compensates for changes in the input current. Since both cores 53 and 55 share the same input winding and are of the same material and physical dimensions, any change in amplitude of the spike caused by a change in the input current is cancelled by an equal and opposite change in the compensating core output winding.

The embodiment of FIG. 3, permits the elimination of the filter capacitors which eliminates the possibility of the common mode failure in which it is postulated that failure of both capacitors will allow the circuit to continue to operate on unfiltered voltage spikes. The circuit also improves overall reliability due to a reduced number of parts required. This reduces costs, especially since the capacitors used are more expensive high reliability hermetic devices. Elimination of the capacitors also makes the duty cycle more maintainable from stage to stage. The smaller parts count not only reduces costs, but means smaller parts inventory and less board real estate are required.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the appended claims and any and all equivalents thereof.

What is claimed is:

1. A dynamic logic unit comprising:
   magnetic core means of rectangular hysteresis loop magnetic material;
   an input winding wound on said core means;
   output winding means wound on the magnetic core means to generate output voltages of opposite polarity at opposite ends thereof;
   a single control winding wound on the magnetic core means, such that with a d-c current applied to the control winding of sufficient magnitude to saturate in one direction at least part of the magnetic core means around which at least part of said output winding means is wound, pulses applied to the input winding which are of sufficient magnitude to saturate the magnetic core means in the opposite direction, generate pulses across the output winding means, while the absence of current through the control winding results in the magnetic core means remaining saturated in said opposite direction to block pulses applied to the input winding from appearing across the output winding means; and
   discriminator-shaper means connected across the opposite ends of said output winding means to generate output pulses similar to the pulses applied to the input winding.

2. The dynamic logic unit of claim 1 wherein said output winding means comprises a center tapped winding having a two ends and a center tap wherein said discriminator-shaper comprises a CMOS flip-flop and a grounded R-C low pass filter connected between each end of the center tapped winding and an input to said CMOS flip-flop, said logic unit including means connecting the center tap of the center tapped winding to ground.

3. The dynamic logic unit of claim 1 wherein said magnetic core means comprises first and second magnetic cores, and wherein said input winding is wound around both the first and second magnetic cores, said control winding is wound around the first magnetic core only, one of said output windings is wound around the first magnetic core only with one polarity, and the other one of said output windings is wound around the second magnetic core only with the opposite polarity.

4. The dynamic logic unit of claim 3 wherein said discriminator-shaper comprises an R-S CMOS flip-flop with one of said output windings connected to the R input of the flip-flop and the other output winding connected to the S input of the flip-flop.

5. A dynamic logic unit comprising:
- a first magnetic core of rectangular hysteresis loop magnetic material;
- a second magnetic core of rectangular hyteresis loop magnetic material;
- an input winding means wound about both the first and second magnetic cores;
- a first output winding wound around the first magnetic core with one polarity;
- a second output winding wound around the second magnetic core with the opposite polarity;
- means connecting said first and second output windings in series; and
- a control winding wound around one of said first or second magnetic cores only such that with a d-c current applied to said control winding of sufficient magnitude to saturate said one magnetic core in one direction, pulses applied to the input coil of sufficient magnitude to saturate said one magnetic core in the opposite direction, generate output pulses across said series connected output windings without voltage spikes.

6. The dynamic logic unit of claim 5 wherein said input winding means is a single coil wound around both magnetic cores.

7. The dynamic logic unit of claim 5 wherein said input winding means comprises a pair of series connected input coils with one of said pair wound around the first magnetic core in one direction and the other wound around the second magnetic core in the same direction.

8. The dynamic logic unit of claim 5 including a flip-flop having a set input and a reset input and means connecting one of said series connected output windings to the set input and the other series connected output winding to the reset input of said flip-flop.

9. The dynamic logic unit of claim 8 wherein said flip-flop is an R-S CMOS flip-flop.

10. The dynamic logic unit of claim 9 wherein said input winding means comprises a single winding around both magnetic cores.

11. A dynamic logic unit comprising:
- a magnetic core of rectangular hysteresis loop magnetic material;
- an input winding wound on said magnetic core;
- a center tapped output winding wound on said magnetic core and having first and second ends;
- means grounding the center tape of said center-tapped output winding;
- a control winding wound on said magnetic core such that with a d-c current applied to the control winding of a magnitude sufficient to saturate the magnetic core in one direction, pulses applied to the input winding of sufficient magnitude to saturate the core in the opposite direction, generate pulses across the output winding;
- a flip-flop having a set input and a reset input; and
- a first grounded R-C low pass filter connected between said first end of the output winding and said set input to the flip-flop and a second grounded R-C low pass filter connected between said second end of the output winding and said reset input to the flip-flop.

12. The dynamic logic unit of claim 11 wherein said flip-flop in an R-S CMOS flip-flop.

* * * * *